United States Patent
Fukuda

(10) Patent No.: US 9,106,827 B2
(45) Date of Patent: Aug. 11, 2015

(54) IMAGE CAPTURING APPARATUS AND METHOD OF CONTROLLING THE SAME

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/260,225

(22) Filed: Apr. 23, 2014

(65) Prior Publication Data

US 2014/0320711 A1    Oct. 30, 2014

(30) Foreign Application Priority Data

Apr. 30, 2013   (JP) ................................ 2013-095959

(51) Int. Cl.
| | |
|---|---|
| *G03B 13/00* | (2006.01) |
| *H04N 5/232* | (2006.01) |
| *H04N 5/228* | (2006.01) |
| *G02B 13/16* | (2006.01) |
| *H04N 5/225* | (2006.01) |
| *H04N 5/369* | (2011.01) |
| *H01L 27/146* | (2006.01) |

(52) U.S. Cl.
CPC ...... *H04N 5/23212* (2013.01); *H01L 27/14627* (2013.01); *H01L 27/14643* (2013.01); *H04N 5/3696* (2013.01)

(58) Field of Classification Search
USPC .............. 250/208.1; 348/222.1, 229.1–230.1, 348/294–324, 335, 343, 345–357; 396/72–83, 124
See application file for complete search history.

(56) References Cited

U.S. PATENT DOCUMENTS

| | | | |
|---|---|---|---|
| 4,410,804 A | 10/1983 | Stauffer | |
| 8,284,295 B2* | 10/2012 | Takahashi | 348/352 |
| 8,502,913 B2* | 8/2013 | Nakayama | 348/364 |
| 8,599,304 B2* | 12/2013 | Hashimoto | 348/350 |
| 8,724,011 B2* | 5/2014 | Nakamoto | 348/345 |
| 8,830,384 B2* | 9/2014 | Endo et al. | 348/354 |
| 2004/0202461 A1* | 10/2004 | Nakahara | 396/104 |
| 2006/0170784 A1* | 8/2006 | Clarke et al. | 348/208.99 |
| 2008/0309771 A1* | 12/2008 | Takahashi | 348/208.4 |
| 2008/0317454 A1* | 12/2008 | Onuki | 396/128 |
| 2009/0096903 A1* | 4/2009 | Kusaka | 348/302 |

(Continued)

FOREIGN PATENT DOCUMENTS

| | | |
|---|---|---|
| JP | 2000-156823 A | 6/2000 |
| JP | 2001-083407 A | 3/2001 |

*Primary Examiner* — Michael Osinski
(74) *Attorney, Agent, or Firm* — Cowan, Liebowitz & Latman, P.C.

(57) ABSTRACT

An image capturing apparatus having an image sensor including focus detection pixels capable of outputting a pair of image signals for focus detection determines whether each line of the pixels of the image sensor is an addition/non-addition line that outputs the image signal suitable/unsuitable for detection of a correlation amount, obtains the correlation amount for each addition line based on the pair of image signals, add the obtained correlation amount of the addition line, counts the number of addition lines, obtains a defocus amount based on the added correlation amount, and drives a focus lens based on the defocus amount when a product of an evaluation value representing reliability of the defocus amount and a predetermined standard number of additions is smaller than the product of the number of addition lines and a standard evaluation value representing a predetermined evaluation value.

15 Claims, 6 Drawing Sheets

(56) References Cited

U.S. PATENT DOCUMENTS

| | | | |
|---|---|---|---|
| 2009/0135289 A1* | 5/2009 | Kusaka | 348/345 |
| 2010/0073527 A1* | 3/2010 | Ichimiya | 348/247 |
| 2010/0277625 A1* | 11/2010 | Utsugi | 348/246 |
| 2011/0157425 A1* | 6/2011 | Nakayama | 348/234 |
| 2011/0228145 A1* | 9/2011 | Kimura | 348/247 |
| 2012/0026372 A1* | 2/2012 | Noguchi et al. | 348/302 |
| 2012/0162494 A1* | 6/2012 | Nakamura | 348/345 |
| 2012/0229696 A1* | 9/2012 | Hashimoto | 348/360 |
| 2013/0286275 A1* | 10/2013 | Ogawa | 348/345 |
| 2014/0016021 A1* | 1/2014 | Uchida | 348/353 |
| 2014/0146218 A1* | 5/2014 | Kunieda et al. | 348/345 |
| 2014/0192249 A1* | 7/2014 | Kishi | 348/349 |
| 2014/0198245 A1* | 7/2014 | Kunugi et al. | 348/349 |
| 2014/0232901 A1* | 8/2014 | Furuta | 348/223.1 |
| 2014/0284449 A1* | 9/2014 | Uchida | 250/201.2 |
| 2014/0300802 A1* | 10/2014 | Hamano | 348/354 |
| 2014/0307925 A1* | 10/2014 | Uemori | 382/106 |

\* cited by examiner

IMAGE CAPTURING APPARATUS AND METHOD OF CONTROLLING THE SAME

BACKGROUND OF THE INVENTION

1. Field of the Invention

The present invention relates to an image capturing apparatus and a method of controlling the same.

2. Description of the Related Art

As a focus detection method performed by an image capturing apparatus, an on-imaging surface phase difference method is used in which focus detection by a phase difference method is performed using focus detection pixels formed in an image sensor.

U.S. Pat. No. 4,410,804 discloses an image capturing apparatus using a two-dimensional image sensor in which one microlens and a plurality of photoelectric conversion units are formed in each pixel. The plurality of photoelectric conversion units are configured to receive light components that have passed through different regions of the exit pupil of an imaging lens via one microlens, thereby dividing the pupil. A correlation amount is calculated from focus detection signals output from pixels (focus detection pixels) each including a plurality of photoelectric conversion units, and an image shift amount is obtained from the correlation amount, thereby performing focus detection by the phase difference method. Japanese Patent Laid-Open No. 2001-083407 discloses generating an image signal by adding focus detection signals output from a plurality of photoelectric conversion units for each pixel.

Japanese Patent Laid-Open No. 2000-156823 discloses an image capturing apparatus in which pairs of focus detection pixels are partially arranged in a two-dimensional image sensor formed from a plurality of imaging pixels. The pairs of focus detection pixels are configured to receive light components from different regions of the exit pupil of an imaging lens via a light shielding layer having openings, thereby dividing the pupil. An image signal is acquired by imaging pixels arranged on most part of the two-dimensional image sensor. A correlation amount is calculated from focus detection signals of the partially arranged focus detection pixels, and an image shift amount is obtained from the correlation amount, thereby performing focus detection by the phase difference method, as disclosed.

In focus detection using the on-imaging surface phase difference method, the defocus direction and the defocus amount can simultaneously be detected by focus detection pixels formed in an image sensor. It is therefore possible to perform focus control at a high speed.

To improve the low luminance limit of focus detection, a method has been proposed which adds a plurality of correlation amounts calculated from the focus detection signals of a plurality of focus detection lines in a focus detection area, and obtains an image shift amount from the added correlation amount (correlation amount after the addition) with little noise. In this method, an evaluation value used to judge the reliability of the image shift amount, and the like are also calculated from the added correlation amount.

The plurality of focus detection lines in the focus detection area may include a line unsuitable for correlation amount detection, such as a saturated line in which the ratio of saturated signals is high or a defective line including a pixel having some defect. When performing focus detection by calculating the added correlation amount of a plurality of focus detection lines included in a focus detection area, the correlation amount of such a line needs to be excluded from addition processing for the added correlation amount. For this reason, the number of correlation amounts to be added to obtain the added correlation amount is not constant but changes. Along with this change, the added correlation amount, the evaluation value calculated from the added correlation amount to judge reliability, and the like also change. Hence, the added correlation amount needs to be normalized.

However, when processing is performed by a computing circuit such as an FPGA, normalization by division of the added correlation amount for each shift amount requires a large computing circuit scale and computing load as compared to addition, multiplication, bit shift operation, and the like.

SUMMARY OF THE INVENTION

The present invention has been made in consideration of the above situation, and makes it possible to suppress the computing circuit scale and computing load and perform accurate focus detection even when a focus detection area includes a line unsuitable for correlation amount detection, such as a defective line or a saturated line in which the ratio of saturated signals is high.

According to the present invention, provided is an image capturing apparatus comprising: an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system; a determination unit configured to determine whether each line of the pixels of the image sensor is a non-addition line that outputs the image signal unsuitable for detection of a correlation amount; a calculation unit configured to obtain the correlation amount for each addition line based on the pair of image signals output from the focus detection pixel included in the addition line determined not to be the non-addition line by the determination unit and add the obtained correlation amount of the addition line; a counting unit configured to count the number of addition lines added by the calculation unit; a computing unit configured to obtain a defocus amount based on the correlation amount added by the calculation unit; and a focus control unit configured to drive a focus lens included in the imaging optical system based on the defocus amount when a product of an evaluation value representing reliability of the defocus amount obtained by the computing unit and a predetermined standard number of additions is smaller than the product of the number of addition lines counted by the counting unit and a standard evaluation value representing a predetermined evaluation value.

According to the present invention, provided is a method of controlling an image capturing apparatus including an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system, the method comprising: a determination step of determining whether each line of the pixels of the image sensor is a non-addition line that outputs the image signal unsuitable for detection of a correlation amount; a calculation step of obtaining the correlation amount for each addition line based on the pair of image signals output from the focus detection pixel included in the addition line determined not to be the non-addition line in the determination step and adding the obtained correlation amount of the addition line; a counting step of counting the number of addition lines added in the calculation step; a computing step of obtaining a defocus amount based on the correlation amount added in the calculation step; and a focus control step of driving a focus lens included in the imaging optical system based on the defocus amount when a product of an evaluation value representing reliability of the defocus amount obtained in the computing step and a predetermined standard number of additions is smaller than the product of the number of addition lines counted in the counting step and a standard evaluation value representing a predetermined evaluation value.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

[Overall Arrangement]

Figure 1:
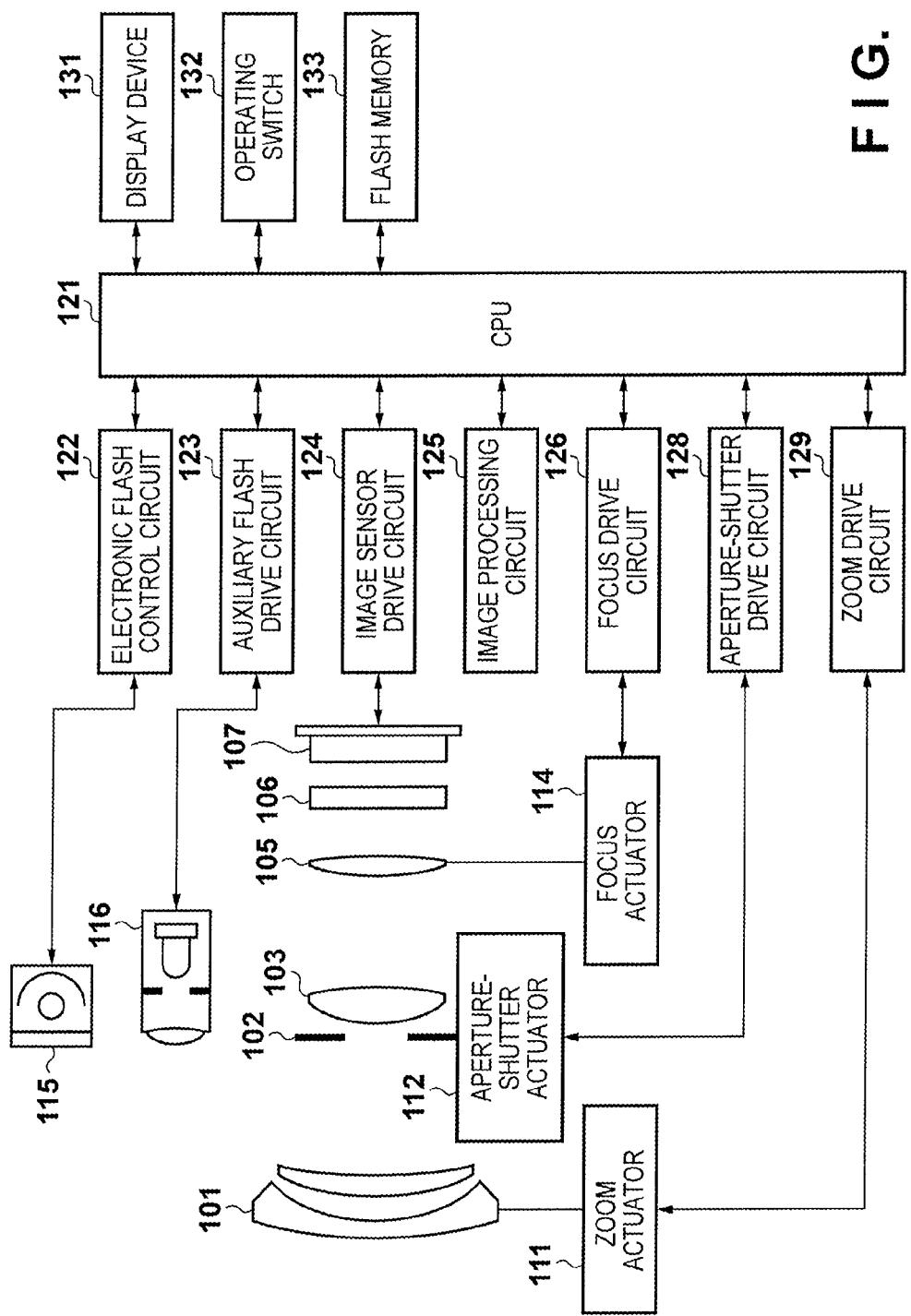
FIG. 1 is a schematic block diagram of an image capturing apparatus according to an embodiment of the present invention.

FIG. 1 is a diagram showing a brief configuration of a camera as an example of an image capturing apparatus having an image sensor according to an embodiment of the present invention. In FIG. 1, a first lens group 101 is disposed on the front end of an imaging optical system, and supported so as to be movable forward and backward along an optical axis. An aperture-shutter 102 adjusts the diameter of its opening, thereby adjusting the amount of light during image sensing, and also has a function to adjust the exposure time during still image sensing. The aperture-shutter 102 and a second lens group 103 move together forward and backward along the optical axis, and, in conjunction with the movement forward and backward of the first lens group 101, provide a magnification change effect (a zoom function).

A third lens group 105 (focus lens) carries out focus adjustment by moving forward and backward along the optical axis. A low-pass optical filter 106 is an optical element for the purpose of reducing false color and moiré of a sensed image.

An image sensor 107 is composed of a two-dimensional CMOS photo sensor and the surrounding circuitry, and disposed on an imaging plane of the imaging optical system.

A zoom actuator 111 carries out a magnification-change operation by rotation of a cam barrel, not shown, to move the first lens group 101 through the second lens group 103 forward and backward along the optical axis. An aperture-shutter actuator 112 controls the diameter of the opening of the aperture-shutter 102 and adjusts the amount of light for image sensing, and also controls the exposure time during still image sensing. A focus actuator 114 moves the third lens group 105 forward and backward along the optical axis to adjust the focus.

An electronic flash 115 for illuminating an object is used during image sensing. A flash illumination device that uses a Xenon tube is preferable, but an illumination device comprised of a continuous-flash LED may also be used. An AF auxiliary flash unit 116 projects an image of a mask having a predetermined opening pattern onto an object field through a projective lens to improve focus detection capability with respect to dark objects and low-contrast objects.

The CPU 121 controls the camera main unit in various ways within the image capturing apparatus. The CPU 121 may, for example, have a calculation unit, ROM, RAM, A/D converter, D/A converter, communication interface circuitry, and so forth. In addition, the CPU 121, based on predetermined programs stored in the ROM, drives the various circuits that the camera has, and executes a set of operations of AF, image sensing, image processing, and recording.

An electronic flash control circuit 122 controls firing of the electronic flash 115 in synchrony with an image sensing operation. An auxiliary flash drive circuit 123 controls firing of the AF auxiliary flash unit 116 in synchrony with a focus detection operation. An image sensor drive circuit 124 controls the image sensing operation of the image sensor 107 as well as A/D-converts acquired image signals and transmits the converted image signals to the CPU 121. An image processing circuit 125 performs such processing as γ conversion, color interpolation, JPEG compression and the like on the images acquired by the image sensor 107.

A focus drive circuit 126 controls the drive of the focus actuator 114 based on the focus detection result to drive the third lens group 105 reciprocally in the optical axis direction, thereby performing focus adjustment. An aperture-shutter drive circuit 128 controls the drive of the aperture-shutter actuator 112, thereby controlling the opening of the aperture-shutter 102. A zoom drive circuit 129 drives the zoom actuator 111 in accordance with the zoom operation of the user.

A display device 131, such as an LCD, displays information relating to the image sensing mode of the camera, preview images before image sensing, confirmation images after image sensing, focus state display images during focus detection, and the like. An operating switch group 132 is composed of a power switch, a release (image sensing trigger) switch, a zoom operation switch, a image sensing mode selection switch, and the like. A detachable flash memory 133 records captured images.

[Image Sensor]

Figure 2:
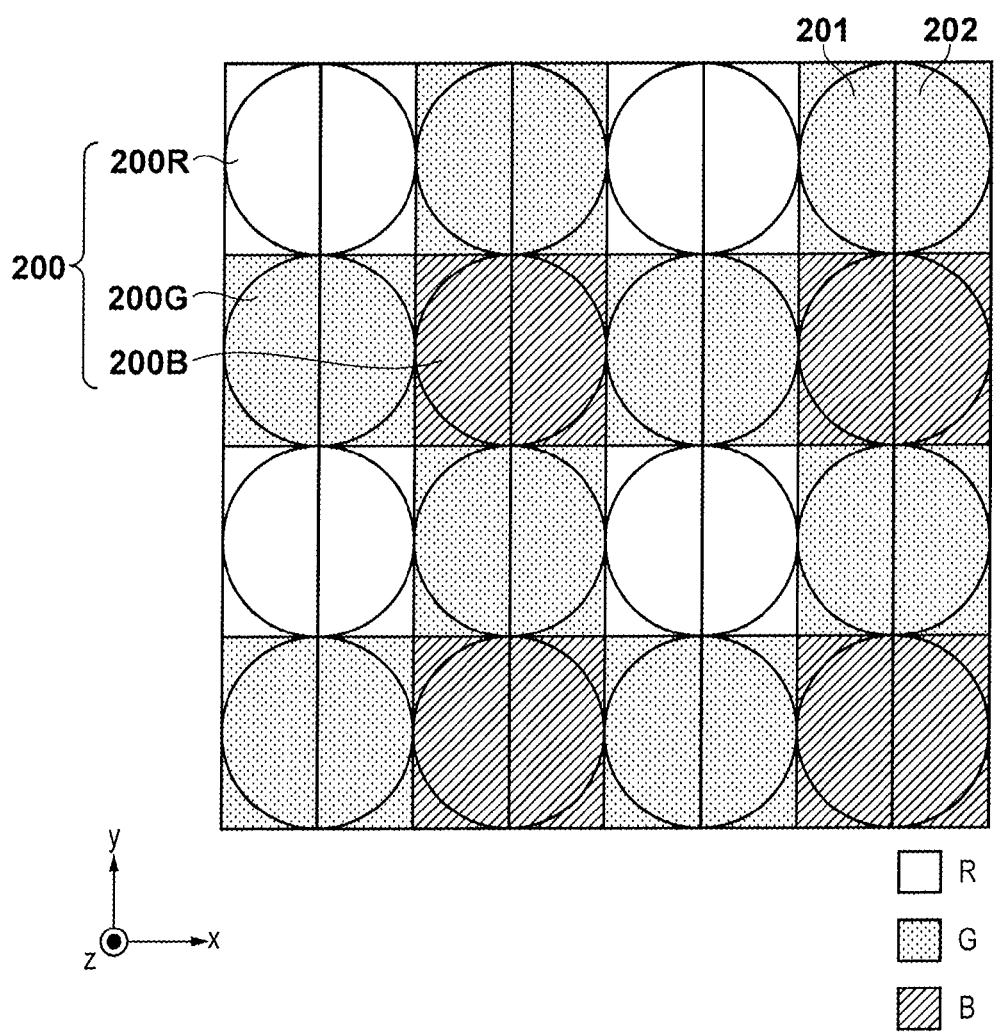
FIG. 2 is a schematic view of a pixel array according to the embodiment.

FIG. 2 shows the outline of the imaging pixels and the array of focus detection pixels of the image sensor 107 according to the embodiment. FIG. 2 illustrates the pixel (imaging pixel) array within the range of 4 columns×4 rows and the focus detection pixel array within the range of 8 columns×4 rows in the two-dimensional CMOS sensor (image sensor) according to this embodiment.

A pixel group 200 includes pixels of 2 columns×2 rows. A pixel 200R having an R (red) spectral sensitivity is arranged at the upper left position, pixels 200G having a G (green) spectral sensitivity are arranged at the upper right and lower left positions, and a pixel 200B having a B (blue) spectral sensitivity is arranged at the lower right position. Each pixel is formed from a first focus detection pixel 201 and a second focus detection pixel 202 arrayed in 2 columns×1 row.

A number of arrays of 4 (columns)×4 (rows) pixels (8 (columns)×4 (rows) focus detection pixels) shown in FIG. 2 are arranged on a plane to enable to capture an image (focus detection signal). In the embodiment, the image sensor will be described assuming that a period P of pixels is 4 μm, the number N of pixels is 5,575 columns in horizontal direction× 3,725 rows in vertical direction=about 20,750,000, a column-direction period PAF of focus detection pixels is 2 μm, and the number NAF of focus detection pixels is 11,150 columns in horizontal direction×3,725 rows in vertical direction=about 41,500,000.

Figures 3A, 3B:
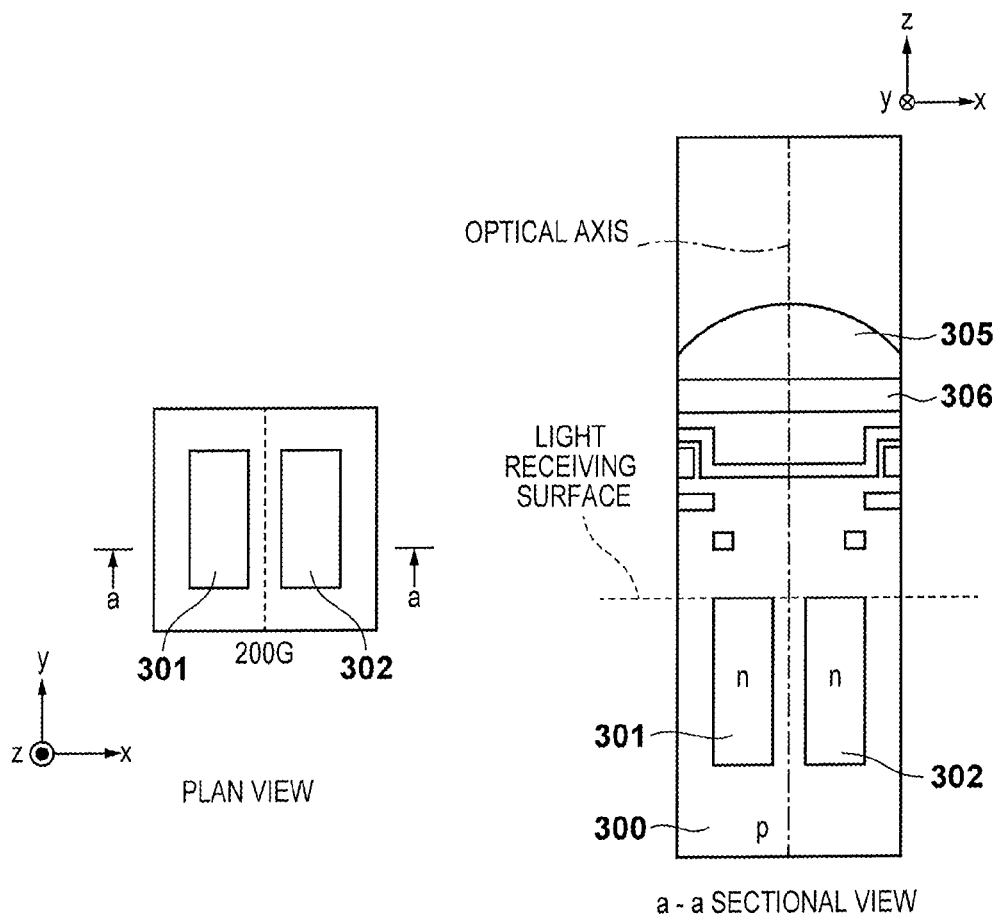
FIGS. 3A and 3B are a schematic plan view and a schematic sectional view, respectively, of a pixel according to the embodiment.

FIG. 3A is a plan view of one pixel 200G of the image sensor show in FIG. 2 when viewed from the light receiving surface side (+z side) of the image sensor 107, and FIG. 3B is a sectional view showing the a-a section in FIG. 3A viewed from the -y side. As shown in FIGS. 3A and 3B, in the pixel 200G according to this embodiment, a microlens 305 for condensing incident light is formed on the light receiving side of each pixel. The pixel is divided by NH (here, divided by two) in the x direction and divided by HV (here, divided by one, or not divided) in the y direction to form photoelectric conversion units 301 and 302. The photoelectric conversion units 301 and 302 correspond to the first focus detection pixel 201 and the second focus detection pixel 202, respectively. Each of the photoelectric conversion units 301 and 302 may be formed as a pin structure photodiode including an intrinsic layer between a p-type layer and an n-type layer or a p-n junction photodiode without an intrinsic layer, as needed.

In each pixel, a color filter 306 is formed between the microlens 305 and the photoelectric conversion units 301 and 302. The spectral transmittance of the color filter may be changed between the focus detection pixels, as needed, or the color filter may be omitted.

Light that has entered the pixel 200G shown in FIGS. 3A and 3B is condensed by the microlens 305, spectrally split by the color filter 306, and received by the photoelectric conversion units 301 and 302. In the photoelectric conversion units 301 and 302, electron-hole pairs are produced in accordance with the received light amount and separated in the depletion layer. Electrons having negative charges are accumulated in the n-type layers (not shown). On the other hand, holes are discharged externally from the image sensor 107 through the p-type layers connected to a constant voltage source (not shown). The electrons accumulated in the n-type layers (not shown) of the photoelectric conversion units 301 and 302 are transferred to electrostatic capacitances (FDs) through transfer gates, converted into voltage signals, and output.

Figure 4:
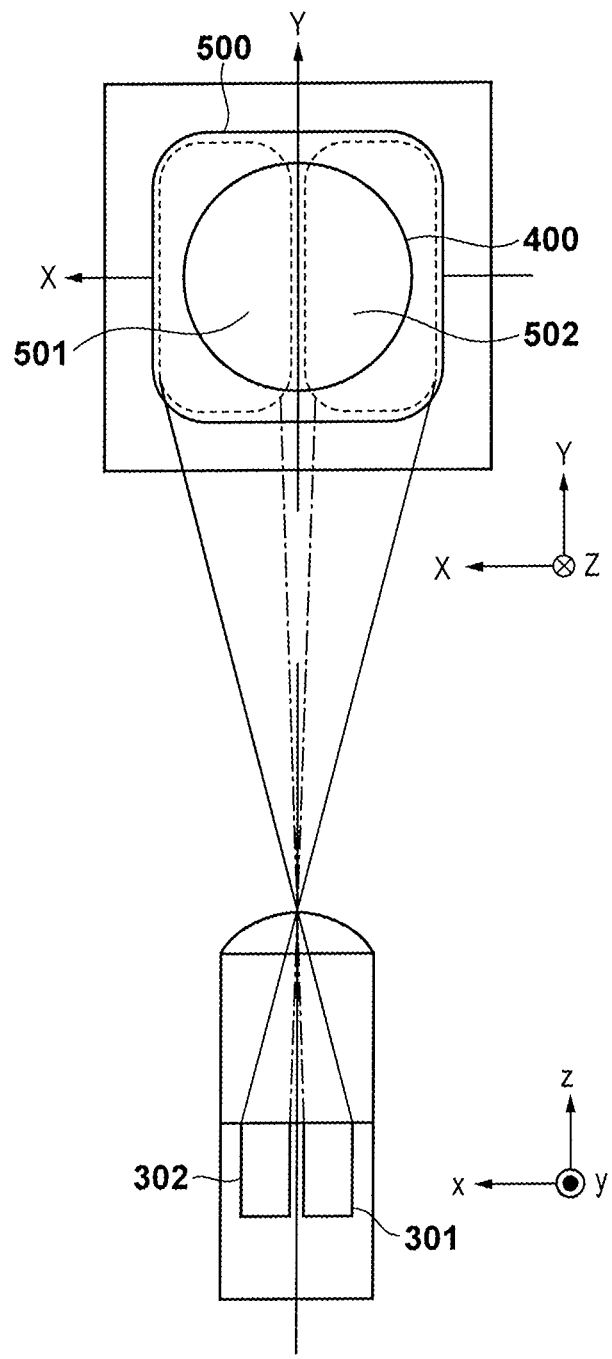
FIG. 4 is a schematic explanatory view of a pixel structure and pupil division according to the embodiment.

The correspondence between pupil division and the pixel structure according to this embodiment shown in FIGS. 3A and 3B will be described with reference to FIG. 4. FIG. 4 illustrates a sectional view showing the a-a section of the pixel structure according to the embodiment shown in FIG. 3A viewed from the +y side and the exit pupil plane of an imaging optical system. Note that in FIG. 4, to obtain correspondence with the coordinate axes of the exit pupil plane, the x- and y-axes of the sectional view are reversed with respect to those of FIGS. 3A and 3B.

A first partial pupil region 501 of the first focus detection pixel 201 represents a pupil region that is almost conjugate with the light receiving surface of the photoelectric conversion unit 301 having a center of gravity decentered in the -x direction via the microlens 305, and light beams that have passed through the first partial pupil region 501 are received by the first focus detection pixel 201. The first partial pupil region 501 of the first focus detection pixel 201 has a center of gravity decentered to the +x side on the pupil plane.

A second partial pupil region 502 of the second focus detection pixel 202 represents a pupil region that is almost conjugate with the light receiving surface of the photoelectric conversion unit 302 having a center of gravity decentered in the +x direction via the microlens 305, and light beams that have passed through the second partial pupil region 502 are received by the second focus detection pixel 202. The second partial pupil region 502 of the second focus detection pixel 202 has a center of gravity decentered to the -x side on the pupil plane.

Light beams that have passed through a pupil region 500 are received by the whole pixel 200G including the photoelectric conversion units 301 and 302 (first focus detection pixel 201 and the second focus detection pixel 202).

Figure 5:
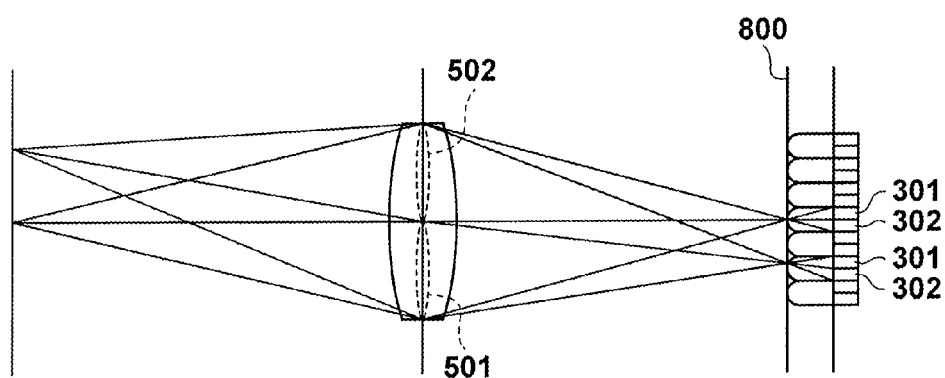
FIG. 5 is a schematic explanatory view of an image sensor and pupil division according to the embodiment.

FIG. 5 is a schematic view showing the correspondence between the image sensor and pupil division according to the embodiment. A pair of light beams that have passed through different exit pupil regions of the imaging optical systems of the first partial pupil region 501 and the second partial pupil region 502 enter the pixels of the image sensor 107 at different incidence angles and are received by the first focus detection pixel 201 and the second focus detection pixel 202 divided into 2×1 parts. In this embodiment, the pupil region is divided into two parts in the horizontal direction. However, the pupil may be divided in the vertical direction, as needed.

Note that in the above-described example, a plurality of imaging pixels each including the first focus detection pixel and the second focus detection pixel are arrayed. However, the present invention is not limited to this. Imaging pixels, first focus detection pixels, and second focus detection pixels may individually be constituted, and the first focus detection pixels and the second focus detection pixels may partially be arranged in part of the imaging pixel array, as needed.

In this embodiment, the light receiving signals of the first focus detection pixels 201 of the respective pixels of the image sensor are collected to generate a first focus detection signal, and the light receiving signals of the second focus detection pixels 202 of the respective pixels are collected to generate a second focus detection signal, thereby performing focus detection. In addition, the signals of the first focus detection pixel 201 and the second focus detection pixel 202 are added for each pixel of the image sensor, thereby generating an image signal (captured image) having a resolution corresponding to the effective number N of pixels.

[Relationship between Defocus Amount and Image Shift Amount]

Figure 6:
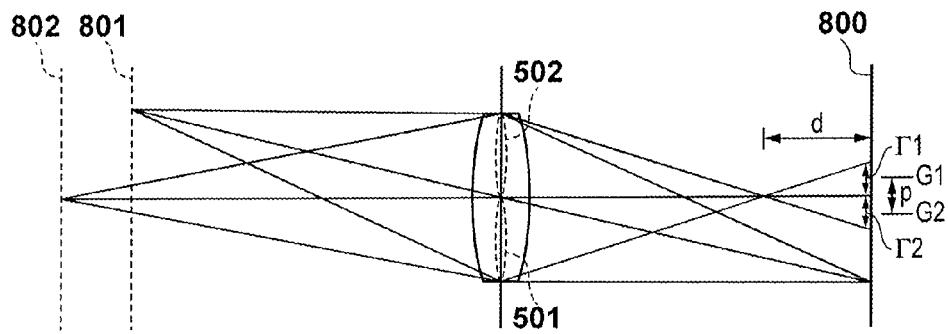
FIG. 6 is a schematic view showing the relationship between the image shift amount and the defocus amount of a first focus detection signal and a second focus detection signal according to the embodiment.

The relationship between the image shift amount and the defocus amount of the first focus detection signal and the second focus detection signal acquired by the image sensor according to this embodiment will be described below. FIG. 6 is a schematic view showing the relationship between the defocus amount of the first focus detection signal and the second focus detection signal and the image shift amount between the first focus detection signal and the second focus detection signal. The image sensor 107 according to this embodiment is arranged on an imaging plane 800. As described with reference to FIGS. 4 and 5, the exit pupil of the imaging optical system is divided into two, the first partial pupil region 501 and the second partial pupil region 502.

A defocus amount d is defined by representing the distance from the imaging position of an object to the imaging plane by a magnitude $|d|$, a front focus state in which the imaging position of an object is located on the object side with respect to the imaging plane by a minus sign (d<0), and a rear focus state in which the imaging position of an object is located on the opposite side of the object with respect to the imaging plane by a positive sign (d>0). An in-focus state in which the imaging position of an object is located on the imaging plane (in-focus position) is represented by d=0. In FIG. 6, an object 801 indicates an example of the in-focus state (d=0), and an object 802 indicates an example of the front focus state (d<0). The front focus state (d<0) and the rear focus state (d>0) will generally be defined as a defocus state (|d|>0).

In the front focus state (d<0), out of the light beam from the object 802, a light beam that has passed through the first partial pupil region 501 (second partial pupil region 502) is temporarily condensed and then spreads to a width Γ1 (Γ2) about a position G1 (G2) of center of gravity of the light beam so as to form a blurred image on the imaging plane 800. The blurred image is received by the first focus detection pixels 201 (second focus detection pixels 202) of the pixels arrayed on the image sensor 107, and a first focus detection signal (second focus detection signal) is generated. Hence, the first focus detection signal (second focus detection signal) is recorded at the position G1 (G2) of center of gravity on the imaging plane 800 as an image of the object 802 blurred to the width Γ1 (Γ2). The blur width Γ1 (Γ2) of the object image increases almost in proportion to an increase in the magnitude |d| of the defocus amount d. Similarly, a magnitude |p| of an image shift amount p (=difference (G1−G2) between centers of gravity of light beam) of the object image between the first focus detection signal and the second focus detection signal also increases almost in proportion to an increase in the magnitude |d| of the defocus amount d. This also applies to the rear focus state (d>0) except that the image shift direction between the first focus detection signal and the second focus detection signal is reverse to that in the front focus state.

As described above, as the magnitude of the defocus amount of the first focus detection signal and the second focus detection signal or the defocus amount of the image capturing signal obtained by adding the first focus detection signal and the second focus detection signal increases, the magnitude of the image shift amount between the first focus detection signal and the second focus detection signal increases.

[Focus Detection]

In this embodiment, focus detection by a phase difference method is performed using the relationship between the image shift amount and the defocus amount of the first focus detection signal and the second focus detection signal. In focus detection by the phase difference method, the first focus detection signal and the second focus detection signal are relatively shifted to calculate a correlation amount representing the signal matching level, and an image shift amount is detected from a shift amount for high correlation (signal matching level). As described above, as the magnitude of the defocus amount of the image signal increases, the magnitude of the image shift amount between the first focus detection signal and the second focus detection signal increases. Based on this relationship, focus detection is performed by converting the image shift amount into a detected defocus amount.

Figure 7:
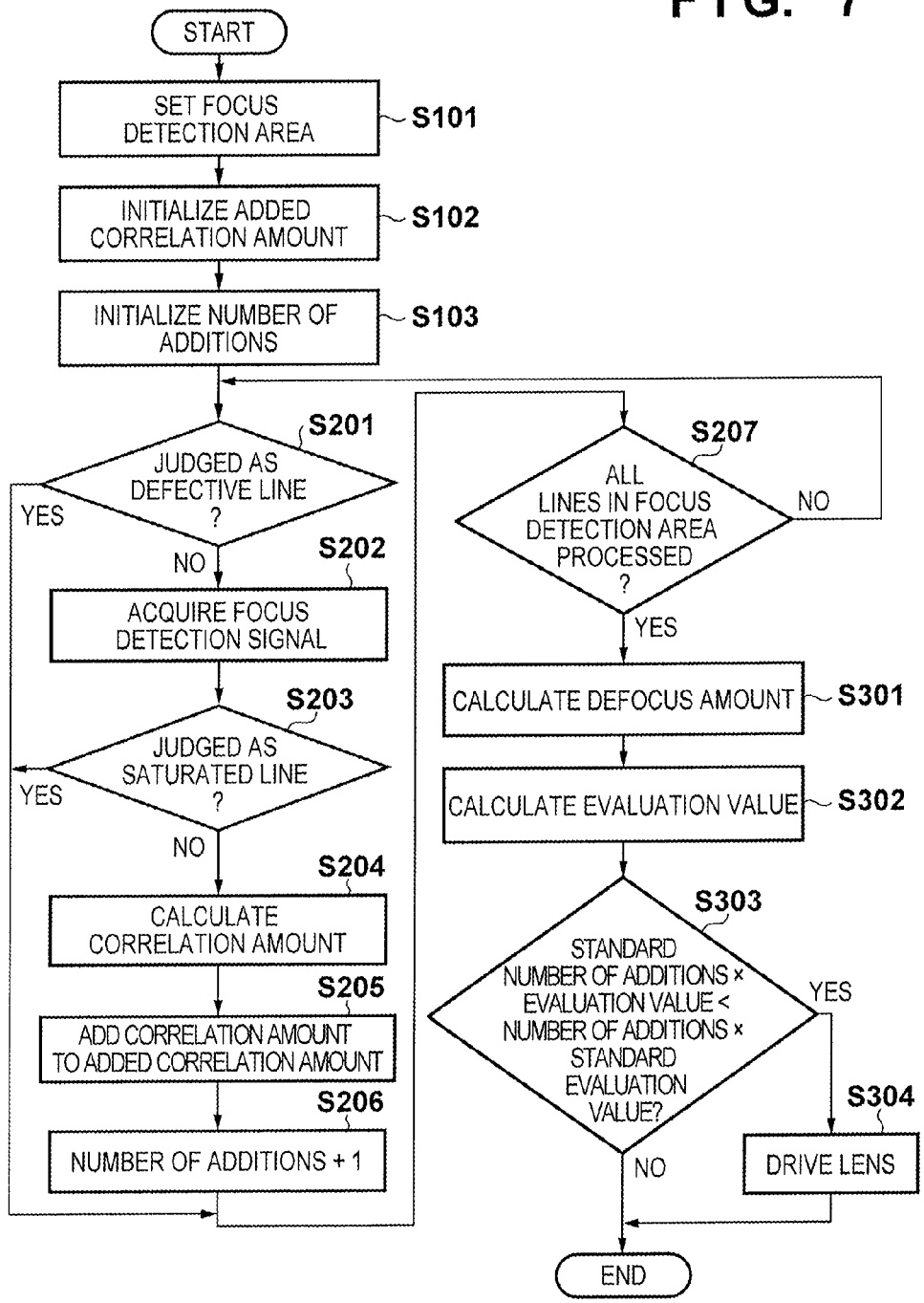
FIG. 7 is a flowchart of focus detection processing according to the embodiment.

FIG. 7 is a flowchart of focus detection processing according to this embodiment. Note that processing shown in FIG. 7 is executed by the image processing circuit 125 and the CPU 121.

In step S101, a focus detection area where focus control is to be performed is set in the effective pixel area of the image sensor 107. By setting the focus detection area, a range W of the focus detection area in the pupil division direction and a shift range Γ of a shift amount s when calculating a correlation amount by relatively shifting the first focus detection signal and the second focus detection signal in the pupil division direction are set. Next, a range L of the focus detection area in a direction perpendicular to the pupil division direction is set, and a plurality of focus detection lines included in the focus detection area are selected. In this embodiment, the horizontal direction of the image sensor 107 is the pupil division direction, and the vertical direction of the image sensor 107 is the direction perpendicular to the pupil division direction.

In step S102, the storage area of an added correlation amount COR(s) is allocated, and all components of the added correlation amount COR(s) are initialized to 0. In step S103, the number Na of additions is initialized to 0.

Next, an lth (l ∈ L) focus detection line included in the range L in the direction perpendicular to the pupil division direction of the focus detection area set in step S101 is selected. Processes of steps S201 to S206 are performed for all focus detection lines included in the range L.

In step S201, it is judged whether the lth focus detection line is a defective line (non-addition line) including a pixel having a certain defect unsuitable for correlation amount detection. Upon judging that the focus detection line is a defective line, it is judged not to calculate the correlation amount of the lth focus detection line, and the process advances to step S207. Upon judging that the focus detection line is not a defective line, the process advances to step S202.

The first focus detection signal or the second focus detection signal may include a defective signal, and the focus detection line may be unsuitable for correlation amount detection, although the image signal is normal and does not affect the captured image due to the circuit arrangement or driving method of the image sensor 107. Hence, defective line information inspected in a mass production step or the like may be recorded in the image processing circuit 125 or the like in advance, and defective line judgment may be done using the recorded defective line information in step S201. Alternatively, the first focus detection signal and the second focus detection signal may be inspected in real time, as needed, to do the defective line judgment.

In step S202, the first focus detection signal is generated from the light receiving signal of the first focus detection pixel of the lth focus detection line, and the second focus detection signal is generated from the light receiving signal of the second focus detection pixel in the focus detection area. The first focus detection signal and the second focus detection signal that are the lth (l ∈ W) in the vertical direction (the direction perpendicular to the pupil division direction) and the kth (k ∈ W) in the horizontal direction (pupil division direction) are represented by A(l, k) and B(l, k), respectively. Note that signal addition processing such as horizontal 3-pixel addition processing for suppressing the signal data amount or Bayer (RGB) addition processing for converting RGB signals into luminance Y signals may be performed for the first focus detection signal and the second focus detection signal, as needed.

In step S203, it is judged whether the lth focus detection line is a saturated line (non-addition line) unsuitable for correlation amount detection. In this embodiment, when a predetermined ratio or more (for example, 75% or more) of at least either the lth first focus detection signals $\{A(l, k): k \in W\}$ or second focus detection signals $\{B(l, k): k \in W\}$ are saturated signals, the lth focus detection line is judged as a saturated line. Upon judging that the focus detection line is a saturated line, it is judged not to calculate the correlation amount of the lth focus detection line, and the process advances to step S207. Upon judging that the focus detection line is not a saturated line (the focus detection line is an addition line), the process advances to step S204.

In a portion where saturated signals continue, the signals have a predetermined maximum value, and image shift amount information is missing. On the other hand, image shift amount information remains at the boundary portion between a saturated signal and an unsaturated signal. To eliminate the influence of the portion where saturated signals continue and extract image shift amount information at the boundary portion between a saturated signal and an unsaturated signal, bandpass filter processing for edge extraction may be performed for the first focus detection signal and the second focus detection signal, as needed. This processing makes it possible to use focus detection information if the boundary portion between a saturated signal and an unsaturated signal exists even if the focus detection line includes a saturated signal. It is therefore possible to suppress the number of focus detection lines excluded in saturated line judgment.

In step S204, based on the first focus detection signals $\{A(l, k): k \in W\}$ and the second focus detection signals $\{B(l, k): k \in W\}$, the correlation amount $COR(l, s)$ of the lth focus detection line is calculated for each lth focus detection line (each addition line) by $$COR(l, s) = \sum_{k \in W} |A(l, k) - B(l, k - s)|, s \in \Gamma \qquad (1)$$

Shift processing is performed by the shift amount s in the pupil division direction so as to associate the kth first focus detection signal $A(l, k)$ with the $(k-s)$th second focus detection signal $B(l, k-s)$ and perform substation, thereby generating a shift subtraction signal. The absolute value of the generated shift subtraction signal is calculated. The sum for the number k is obtained within the range W of the focus detection area in the pupil division direction, and the correlation amount $COR(l, s)$ of the lth focus detection line is calculated.

In step S205, the correlation amount $COR(l, s)$ of the lth focus detection line obtained in step S204 is added to the added correlation amount $COR(s)$ for each shift amount s, and the process advances to step S206. In step S206, the number Na of additions is incremented by one to count the number of addition lines. In step S207, it is determined whether the processing has ended for all focus detection lines included in the focus detection area. If the processing has not ended, the process returns to step S201 to perform processing of the next focus detection line. If the processing has ended for all focus detection lines, the process advances to step S301.

Note that a case has been described above in which the processes of steps S201 to S207 are sequentially performed for the focus detection lines included in the focus detection area. However, parallel processing may be performed to process two or more focus detection lines in parallel.

As described above, in this embodiment, correlation amount of defective lines, saturated lines, and the like unsuitable for correlation amount detection are excluded from obtaining the added correlation amount, thereby preventing the added correlation amount from being mixed with wrong image shift amount information, and performing accurate focus detection.

Next, in step S301 of FIG. 7, a defocus amount is calculated. First, a shift amount of a real number value that minimizes the added correlation amount is calculated by subpixel computation from the added correlation amount, and the image shift amount p is calculated. The calculated image shift amount p is multiplied by the image height of the focus detection area, the f number of the imaging lens (imaging optical system), and a conversion coefficient K corresponding to the exit pupil distance to calculate a detected defocus amount, and the process advances to step S302.

In step S302, an evaluation value used to judge the reliability of the defocus amount is calculated. In this embodiment, the minimum value (image matching level) of the added correlation amount calculated by subpixel computation from the added correlation amount is calculated as the evaluation value. The higher the shape matching level between the first focus detection signal and the second focus detection signal is, the smaller the minimum value (image matching level) of the added correlation amount is, and the higher the reliability of the focus detection result is. The slope of the added correlation amount (the first order derivative of the added correlation amount) at the position of the calculated image shift amount p may be obtained as the evaluation value.

In step S303, the reliability of the defocus amount is judged. In this embodiment, a standard evaluation value representing the reliability when the number of additions is the standard number of additions is held in advance. When the product of the standard number of additions and the evaluation value is smaller than the product of the number of additions and the standard evaluation value, the reliability of the defocus amount is judged as high, and the process advances to step S304. If the product of the standard number of additions and the evaluation value is equal to or larger than the product of the number of additions and the standard evaluation value, the reliability of the defocus amount is judged as low, and the focus detection ends. In step S304, the lens is driven in accordance with the detected defocus amount.

In this embodiment, since the correlation amounts of defective lines and saturated lines are not added, the number of correlation amounts added to the added correlation amount is not constant but changes. Along with the change in the number of additions, the added correlation amount and the evaluation value (the minimum value or slope of the added correlation amount) calculated from the added correlation amount to judge reliability also change. Hence, to obtain an appropriate evaluation value, normally, normalization of dividing the added correlation amount by the number of additions for each shift amount is necessary. However, when digital processing is performed by a computing circuit such as an FPGA, normalization processing by division of the added correlation amount for each shift amount requires a large computing circuit scale and computing load as compared to addition, multiplication, bit shift operation, and the like.

In this embodiment, however, instead of normalizing the added correlation amount, the reliability of the defocus amount is judged by comparing the product of the standard number of additions and the evaluation value with the product of the number of additions and the standard evaluation value.

Note that to further simplify the reliability judgment formula, a standard predetermined amount when the standard number of additions is 1 is held. This makes it possible to judge the reliability of the detected defocus amount by comparing the evaluation value (the product of 1 and the evaluation value) with the product of the number of additions and the standard evaluation value.

With the above-described arrangement, it is possible to suppress the computing circuit scale and computing load and perform accurate focus detection even when a line (non-addition line) unsuitable for correlation amount detection, such as a saturated line in which the ratio of saturated signals is high or a defective line including a pixel having a certain defect is included.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-095959, filed on Apr. 30, 2013 which is hereby incorporated by reference herein in its entirety.

What is claimed is:

1. An image capturing apparatus comprising:
an image sensor including a plurality of pixels that are two-dimensionally arranged and include focus detection pixels including photoelectric conversion units configured for outputting a pair of image signals obtained by receiving a pair of light beams that have passed through different exit pupil regions of an imaging optical system;
a determination unit configured to determine whether each line of the pixels of said image sensor is a non-addition line that outputs an image signal unsuitable for detection of a correlation amount;
a calculation unit configured to obtain the correlation amount for each addition line based on the pair of image signals output from the focus detection pixels included in the addition line determined not to be the non-addition line by said determination unit and add the obtained correlation amount of the addition line;
a counting unit configured to count the number of addition lines added by said calculation unit;
a computing unit configured to obtain a defocus amount based on the correlation amount added by said calculation unit; and
a focus control unit configured to drive a focus lens included in the imaging optical system based on the defocus amount in a case where a product of an evaluation value representing reliability of the defocus amount obtained by said computing unit and a predetermined standard number of additions is smaller than the product of the number of addition lines counted by said counting unit and a standard evaluation value representing a predetermined evaluation value.

2. The apparatus according to claim 1, wherein said calculation unit
calculates the correlation amount for each shift amount while shifting the pair of image signals relative to each other by a predetermined amount, and
adds the correlation amount of the addition line for each shift amount.

3. The apparatus according to claim 2, wherein the evaluation value of the defocus amount is a minimum value of the correlation amount of the addition line added for each shift amount.

4. The apparatus according to claim 1, wherein the non-addition line includes at least one of a line including a defect and a line in which at least one of the pair of image signals includes saturated image signals at a predetermined ratio or more.

5. The apparatus according to claim 1, further comprising a setting unit configured to set a focus detection area to detect a focus from an area of said image sensor,
wherein said determination unit determines the line of the pixels included in the focus detection area.

6. The apparatus according to claim 1, wherein the standard number of additions is 1.

7. A method of controlling an image capturing apparatus including an image sensor including a plurality of pixels that are two-dimensionally arranged and include focus detection pixels including photoelectric conversion units configured for outputting a pair of image signals obtained by receiving a pair of light beams that have passed through different exit pupil regions of an imaging optical system, the method comprising:
a determination step of determining whether each line of the pixels of the image sensor is a non-addition line that outputs an image signal unsuitable for detection of a correlation amount;
a calculation step of obtaining the correlation amount for each addition line based on the pair of image signals output from the focus detection pixels included in the addition line determined not to be the non-addition line in the determination step and adding the obtained correlation amount of the addition line;
a counting step of counting the number of addition lines added in the calculation step;
a computing step of obtaining a defocus amount based on the correlation amount added in the calculation step; and
a focus control step of driving a focus lens included in the imaging optical system based on the defocus amount in a case where a product of an evaluation value representing reliability of the defocus amount obtained in the computing step and a predetermined standard number of additions is smaller than the product of the number of addition lines counted in the counting step and a standard evaluation value representing a predetermined evaluation value.

8. An image capturing apparatus comprising:
an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system;
a determination unit configured to determine whether each line of the pixels of said image sensor is a non-addition line that outputs the image signal unsuitable for detection of a correlation amount;
a calculation unit configured to obtain the correlation amount for each addition line based on the pair of image signals output from the focus detection pixels included in the addition line determined not to be the non-addition line by said determination unit and add the obtained correlation amount of the addition line;
a counting unit configured to count the number of addition lines added by said calculation unit;
a computing unit configured to obtain a defocus amount based on the correlation amount added by said calculation unit; and
a focus control unit configured to drive a focus lens included in the imaging optical system based on the defocus amount in a case where a product of the correlation amount of the addition line calculated by the calculation unit and a predetermined standard number of additions is smaller than the product of the number of addition lines counted by said counting unit and a standard correlation amount representing a predetermined correlation amount of the addition line.

9. The apparatus according to claim 8, wherein said calculation unit
calculates the correlation amount for each shift amount while shifting the pair of image signals relative to each other by a predetermined amount, and adds the correlation amount of the addition line for each shift amount.

10. A method of controlling an image capturing apparatus including an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system, the method comprising:
   a determination step of determining whether each line of the pixels of the image sensor is a non-addition line that outputs the image signal unsuitable for detection of a correlation amount;
   a calculation step of obtaining the correlation amount for each addition line based on the pair of image signals output from the focus detection pixels included in the addition line determined not to be the non-addition line in the determination step and adding the obtained correlation amount of the addition line;
   a counting step of counting the number of addition lines added in the calculation step;
   a computing step of obtaining a defocus amount based on the correlation amount added in the calculation step; and
   a focus control step of driving a focus lens included in the imaging optical system based on the defocus amount in a case where a product of the correlation amount of the addition line calculated in the calculation step and a predetermined standard number of additions is smaller than the product of the number of addition lines counted in the counting step and a standard correlation amount representing a predetermined correlation amount of the addition line.

11. The method according to claim 10, wherein the calculation step
   calculates the correlation amount for each shift amount while shifting the pair of image signals relative to each other by a predetermined amount, and
   adds the correlation amount of the addition line for each shift amount.

12. An image capturing apparatus comprising:
   an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system;
   a determination unit configured to determine whether each line of the pixels of said image sensor is an addition line that outputs the image signal suitable for detection of a correlation amount;
   a calculation unit configured to obtain the correlation amount for each addition line determined by said determination unit based on the pair of image signals output from the focus detection pixels included in the addition line and add the obtained correlation amount of the addition line;
   a counting unit configured to count the number of addition lines added by said calculation unit;
   a computing unit configured to obtain a defocus amount based on the correlation amount added by said calculation unit; and
   a focus control unit configured to drive a focus lens included in the imaging optical system based on the defocus amount in a case where a product of an evaluation value representing reliability of the defocus amount obtained by said computing unit and a predetermined standard number of additions is smaller than the product of the number of addition lines counted by said counting unit and a standard evaluation value representing a predetermined evaluation value.

13. A method of controlling an image capturing apparatus including an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system, the method comprising:
   a determination step of determining whether each line of the pixels of the image sensor is an addition line that outputs the image signal suitable for detection of a correlation amount;
   a calculation step of obtaining the correlation amount for each addition line determined in the determination step based on the pair of image signals output from the focus detection pixels included in the addition line and adding the obtained correlation amount of the addition line;
   a counting step of counting the number of addition lines added in the calculation step;
   a computing step of obtaining a defocus amount based on the correlation amount added in the calculation step; and
   a focus control step of driving a focus lens included in the imaging optical system based on the defocus amount in a case where a product of an evaluation value representing reliability of the defocus amount obtained in the computing step and a predetermined standard number of additions is smaller than the product of the number of addition lines counted in the counting step and a standard evaluation value representing a predetermined evaluation value.

14. An image capturing apparatus comprising:
   an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system;
   a determination unit configured to determine whether each line of the pixels of said image sensor is an addition line that outputs the image signal suitable for detection of a correlation amount;
   a calculation unit configured to obtain the correlation amount for each addition line determined by said determination unit based on the pair of image signals output from the focus detection pixels included in the addition line and add the obtained correlation amount of the addition line;
   a counting unit configured to count the number of addition lines added by said calculation unit;
   a computing unit configured to obtain a defocus amount based on the correlation amount added by said calculation unit; and
   a focus control unit configured to drive a focus lens included in the imaging optical system based on the defocus amount in a case where a product of the correlation amount of the addition line calculated by the calculation unit and a predetermined standard number of additions is smaller than the product of the number of addition lines counted by said counting unit and a standard correlation amount representing a predetermined correlation amount of the addition line.

15. A method of controlling an image capturing apparatus including an image sensor including a plurality of pixels that are two-dimensionally arranged and include focus detection pixels including photoelectric conversion units capable of outputting a pair of image signals obtained by receiving a pair of light beams that have passed through different exit pupil regions of an imaging optical system, the method comprising:

a determination step of determining whether each line of the pixels of the image sensor is an addition line that outputs the image signal suitable for detection of a correlation amount;

a calculation step of obtaining the correlation amount for each addition line determined in the determination step based on the pair of image signals output from the focus detection pixels included in the addition line and adding the obtained correlation amount of the addition line;

a counting step of counting the number of addition lines added in the calculation step;

a computing step of obtaining a defocus amount based on the correlation amount added in the calculation step; and a focus control step of driving a focus lens included in the imaging optical system based on the defocus amount in a case where a product of the correlation amount of the addition line calculated in the calculation step and a predetermined standard number of additions is smaller than the product of the number of addition lines counted in the counting step and a standard correlation amount representing a predetermined correlation amount of the addition line.

* * * * *